April 4, 1967

D. GRASMÜCK 3,312,835

FREQUENCY DIVISION TIMING CIRCUIT EMPLOYING SHUNTING CIRCUIT FOR INHIBITING FALSE RESET SIGNALS TO FLIP-FLOP STAGES

Filed Dec. 3, 1963

2 Sheets-Sheet 1

Inventor
Dieter Grasmück
By McGlew and Toren
Attorneys

April 4, 1967

D. GRASMÜCK 3,312,835

FREQUENCY DIVISION TIMING CIRCUIT EMPLOYING
SHUNTING CIRCUIT FOR INHIBITING FALSE
RESET SIGNALS TO FLIP-FLOP STAGES

Filed Dec. 3, 1963

2 Sheets-Sheet 2

Inventor
Dieter Grasmück
By Mulglaw and Torew
Attorneys

United States Patent Office 3,312,835

Patented Apr. 4, 1967

3,312,835

FREQUENCY DIVISION TIMING CIRCUIT EMPLOYING SHUNTING CIRCUIT FOR INHIBITING FALSE RESET SIGNALS TO FLIP-FLOP STAGES

Dieter Grasmück, Darmstadt, Germany, assignor to Bolkow Gesellschaft mit beschrankter Haftung, Munich, Germany Filed Dec. 3, 1963, Ser. No. 327,643
Claims priority, application Germany, Dec. 5, 1962, B 69,869
6 Claims. (Cl. 307—88.5)

This invention relates to frequency division timing circuits and, more particularly, to novel electronic means operable to prevent resetting of such circuits by spurious pulses resulting from sharp load changes on a common current source supplying such circuits.

One known manner of attaining timed control of electronic circuits is to derive the individual time spans, or durations, by division of the frequency of a master generator. This is effected by the use of flip-flop stages, which are also known as dividing or keying stages, and which are reset to their initial position before the electronic circuitry is activated.

The resetting is effected by a pulse generated by a differentiating means or component, this generated pulse being supplied to a reset line commonly connected to all of the flip-flop stages. Each of the time periods or time spans which can be tapped from the individual flip-flop stages is thus maintained in a respective fixed ratio to the switch-on instant.

When frequency division timing circuits of this type are supplied from a common current source which also supplies current to additional loads, this coordination of the individual time spans to the switch-on instant is disrupted where the load on the current source changes sharply, during the operating period of the timing circuit, due to sharp changes in the current drawn by the other loads.

In the case of high-ohmic current sources, such as cold batteries, changes in load cause changes in voltage. These changes in voltage, being effective upon the differentiating means of the timing circuit, result in the latter delivering a restoring or resetting pulse to the flip-flop stages, thus disrupting the mutual coordination. As a result, it becomes impossible to have timed control of the electronic circuitry.

The principal object of the present invention is to obviate this difficulty in frequency division timing circuits comprising flip-flop stages supplied from a common current source and restorted to their initial position by a pulse delivered along a common reset line. In accordance with the invention, this is effected by providing an electronic switch which short circuits the reset line responsive to switching on of the timing circuit. The circuit components included in this electronic switch include a component in the form of time delay means effective to delay operation of the electronic switch for a maximum period equal to the duration or predetermined time period of the reset pulse. As a result, spurious pulses resulting from changes in the load on the common current source no longer have any effect on the flip-flop stages.

In a preferred embodiment of the invention, the short circuit means includes the emitter-collector or output path of a transistor whose base has the starting or initial voltage applied thereto across an RC combination capable of providing the required time delay. In order to avoid the necessity of employing very low-ohmic transistors in the case where there is a slight plate resistance of the current source, a resistance may be inserted between the differentiating means, which generates the reset pulses, and the collector of the transistor.

In the following description, the application of the invention will be described as employed in a guidance signal generator for automatically controlled traveling bodies. As is known to those skilled in the art, in such generators a common current source supplies voltages to different loads, the energizing and operating spans of which are programmed in a predetermined manner.

For an understanding of the principles of the invention, reference is made to the following description of typical embodiments thereof as illustrated in the accompanying drawings.

Figure 1:
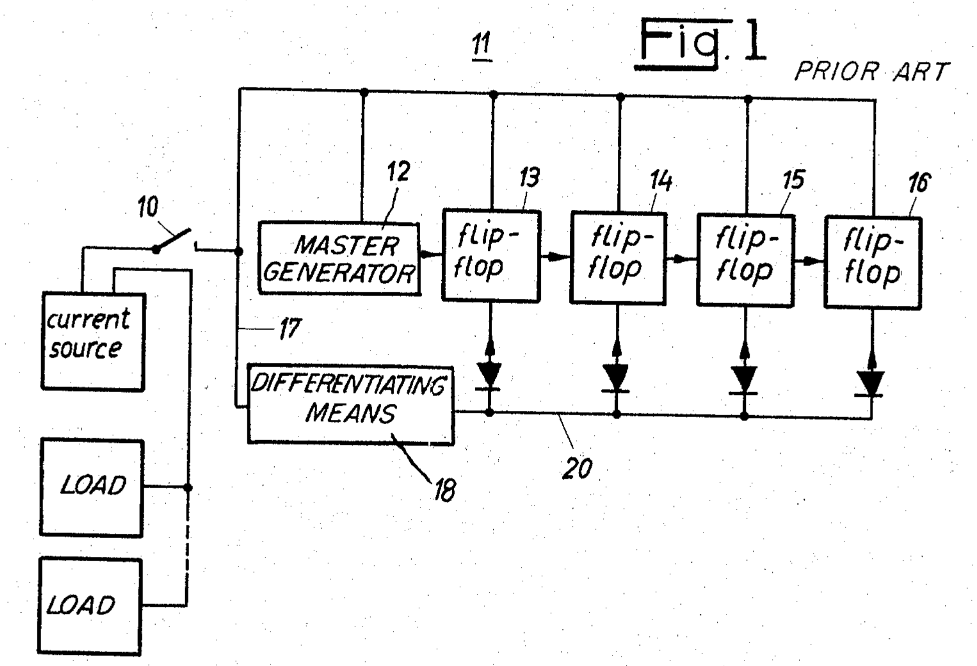
FIG. 1 is a block diagram of a conventional type of frequency division timing circuit including flip-flop stages and a common reset line.

Referring to FIG. 1, a current source, which may be any type of current source and which has not been specifically illustrated, is connected, by means of a switch 10, with a frequency division timing circuit 11 comprising a master generator 12 and flip-flop stages 13, 14, 15 and 16 controlled by generator 12. A conductor or switch-on line 17 extends from switch 10 to a differentiating means 18 whose output is connected to a common reset line 20 which is connected to each of the flip-flop stages 13–16. Frequency division timing circuit 11 is responsive to negative re-set pulses only.

Upon closing of switch 10, the voltage of the current source is impressed on the frequency division timing circuit 11 so that the starting, or switch-on, voltage surge, differentiated by the differentiating means 18, is supplied as a negative pulse to the flip-flop stages 13–16 along the common reset line 20 to act as a reset pulse. This restores the flip-flop stages to their initial position. At the same time, master generator 12 has been excited, and its output signal voltage, which has a predetermined frequency, is sub-divided by the flip-flop stages 13–16 in the intended manner.

As previously mentioned, the coordination of the individual flip-flop stages is disrupted when spurious or interference pulses, due to changes in the common current source responsive to irregular or sudden changes of voltage and of appreciable magnitudes, causes differentiating means 18 to deliver a pulse to the common reset line 20. Such changes in the common current source are the result of changes, and usually sharp changes, in the load drawn by other loads connected to the common current source. Particularly in the case of guidance signal generators, this undesirable condition causes the occurrence of uncontrollable operating conditions.

Figure 2:
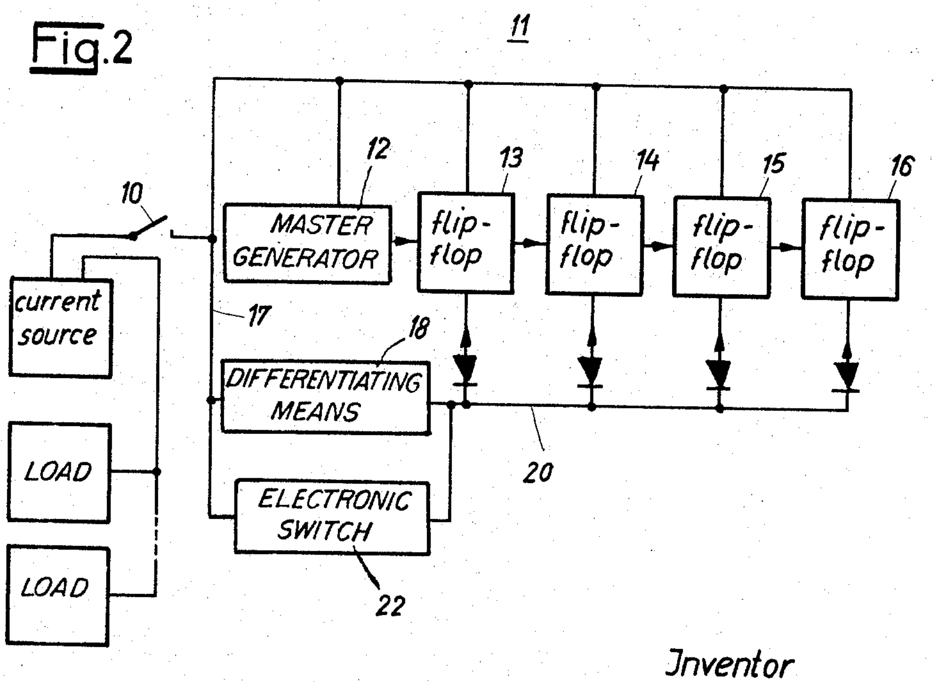
FIG. 2 is a block diagram of the circuit shown in FIG. 1 as modified in accordance with the invention.

In accordance with the invention, as illustrated in block form in FIG. 2, such conditions are obviated by connecting an electronic switching means 22 in parallel with the differentiating means 18. This electronic switching means 22 prevents any spurious signals from having a disrupting effect upon the frequency division timing circuit 11. In FIG. 2, it may be mentioned, the same reference characters have been given to the same circuit components appearing in FIG. 1.

Figures 3, 4:
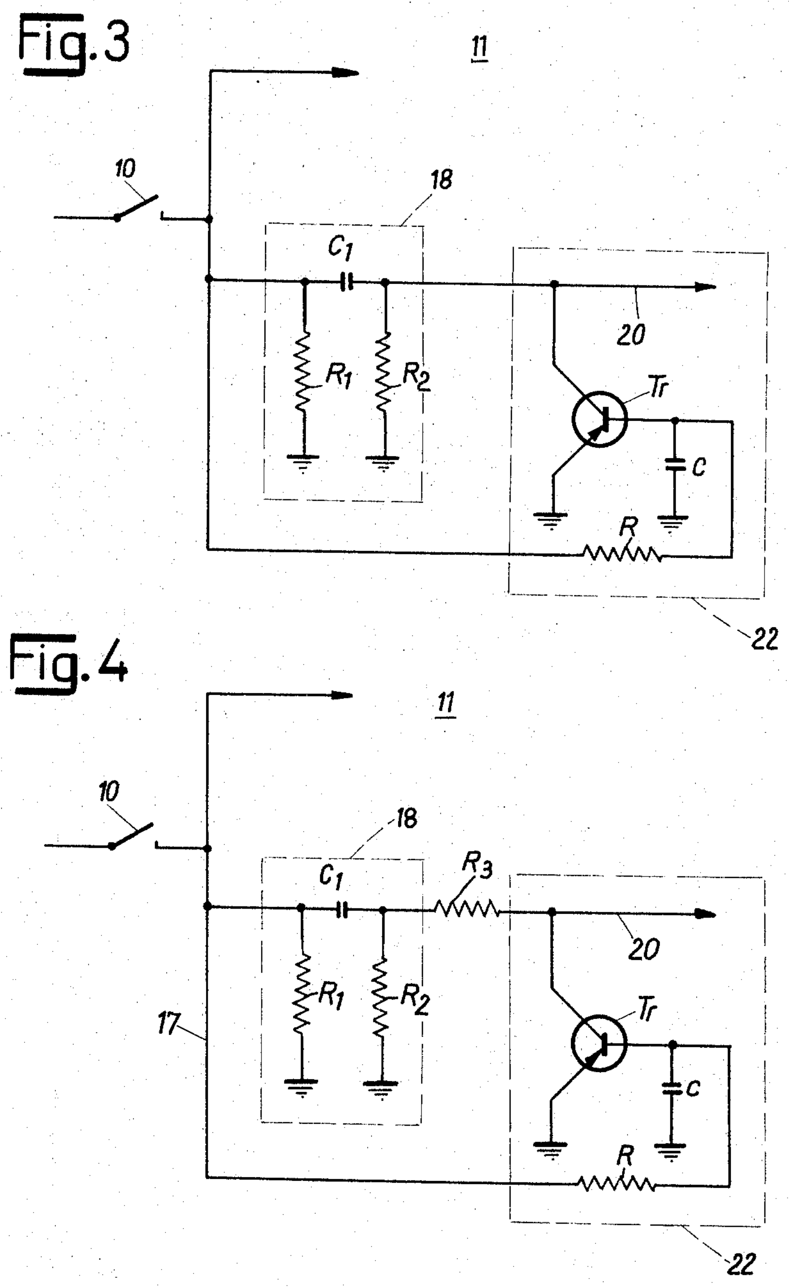
FIG. 3 is a schematic wiring diagram of one embodiment of the electronic switch short circuit means according to the invention.
FIG. 4 is a schematic wiring diagram of another embodiment of the electronic switch short circuit means in accordance with the invention.

Referring to FIG. 3, one form of such an electronic switch comprises a transistor *Tr* whose collector is connected to the reset line 20 and whose emitter is grounded. The base of transistor *Tr* is connected to ground across a capacitor C, and receives a switch-on pulse through the starting line 17 including the resistance R. Capacitor C is so dimensioned that the common reset line 20 of the frequency division timing circuit 11 is short circuited through the transistor T*r*, responsive to energization of the system, and with a time delay having a maximum period equal to the duration of a reset pulse.

Thus, even though additional loads are connected to the common current source (not illustrated), pulses resulting from sufficiently large changes in load on the common current source, and converted into reset pulses by differentiating means 18, have no effect on the flip-flop stages 13–16. As illustrated in FIG. 2, such differentiating means may comprise a capacitor $C_1$ and resistances $R_1$ and $R_2$.

In the arrangement shown in FIG. 4, the electronic short circuiting switch differs from that shown in FIG. 3 in that a resistance $R_3$ is connected between differentiating means 18 and the collector of transistor T*r*.

In both of the arrangements shown in FIGS. 3 and 4, the application of a biasing voltage to the base of transistor T*r* is effected by closing switch 10, and after a time delay due to the RC combination and having a maximum period equal to the duration of a reset pulse. This triggers the transistor T*r* to become conductive and thus to act as a short circuiting connection for the common reset line 20. Blocking of transistor T*r* is effected by opening switch 10. Resetting of the flip-flop stages, which requires that transistor T*r* be non-conductive or blocked, is necessary only at the beginning of a new control procedure. Such a new control procedure always is initiated by closing of switch 10. At the instant switch 10 is closed, transistor T*r* is still blocked or non-conductive, as this transistor becomes conducting only after a delay time determined by the condenser C.

While specific embodiments of the invention have been shown and described in detail to illustrate the application of the principles of the invention, it will be understood that the invention may be embodied otherwise without departing from such principles.

What is claimed is:

1. In a frequency division timing circuit including a master generator, plural flip-flop stages connected in series to said master generator to divide the frequency of the latter to provide predetermined timed periods, differentiating means, a re-set line commonly connecting said differentiating means to said flip-flop stages for re-setting of the latter to an initial position, and switch means operable, when closed, to connect said master generator and said differentiating means to a current source which is also connected to supply other loads, said differentiating means differentiating the initial voltage surge, appearing responsive to closure of said switch means, to apply a re-set pulse to said re-set line; electronic means operable to prevent re-setting of said stages by a spurious pulse from said differentiating means resulting from sharp changes in the load on said common source drawn by said other loads, said electronic means comprising, in combination, circuit components connected to said re-set line between said flip-flop stages and said switch means and shunting said differentiating means, said circuit components being operative to shunt said spurious or false re-set pulses to inhibit false re-setting of said flip-flop stages; and a time delay means included in said circuit components, said time delay means being operative, in response to closure of said switch means, to effectively delay operation of said components for a predetermined time period equal to a re-set pulse, whereby re-setting of said flip-flop stages may take place during a normal re-set operation.

2. In a frequency division timing circuit, electronic means as claimed in claim 1, including a resistance connected in said reset line between said differentiating means and said electronic means.

3. In a frequency division timing circuit, electronic means as claimed in claim 1, in which said circuit components include a transistor having its output circuit connected between said reset line and ground and having its base connected to said switch means.

4. In a frequency division timing circuit, electronic means as claimed in claim 3, in which the emitter-collector circuit of said transistor is connected between said reset line and ground, and the base of said transistor is connected to said switch means; said time delay means comprising an RC combination connected between said switch means and said base.

5. In a frequency division timing circuit, electronic means as claimed in claim 4, including a resistance connected between said differentiating means and the collector of said transistor.

6. In a frequency division timing circuit, electronic means as claimed in claim 1, in which said circuit components include a transistor having a grounded emitter configuration connected to said reset line.

References Cited by the Examiner

UNITED STATES PATENTS 2,832,900 4/1958 Ford -------------- 307—88.5

OTHER REFERENCES

Motorola Semiconductor Products, Inc., "Transient Protection of Mesa Transistors," by Roehr, published December 1960.

ARTHUR GAUSS, *Primary Examiner.*

J. S. HEYMAN, *Assistant Examiner.*